(12) United States Patent
Roehrl et al.

(10) Patent No.: US 9,736,960 B2
(45) Date of Patent: Aug. 15, 2017

(54) FRAMEWORK FOR ELECTRONIC OR NETWORK CABINETS

(71) Applicant: Knuerr GmbH, Arnstorf (DE)

(72) Inventors: Max Roehrl, Aufhausen (DE); Werner Spateneder, Pfarrkirchen (DE)

(73) Assignee: Knuerr GmbH, Arnstorf (DE)

( * ) Notice: Subject to any disclaimer, the term of this patent is extended or adjusted under 35 U.S.C. 154(b) by 0 days.

(21) Appl. No.: 14/715,692

(22) Filed: May 19, 2015

(65) Prior Publication Data
US 2015/0342082 A1    Nov. 26, 2015

(30) Foreign Application Priority Data
May 21, 2014 (DE) ............... 10 2014 107 168

(51) Int. Cl.
| | |
|---|---|
| A47F 7/00 | (2006.01) |
| H05K 7/18 | (2006.01) |
| H05K 7/14 | (2006.01) |
| H05K 5/02 | (2006.01) |
| A47B 47/00 | (2006.01) |
| H02B 1/01 | (2006.01) |

(52) U.S. Cl.
CPC ............... *H05K 7/18* (2013.01); *A47B 47/00* (2013.01); *H05K 5/0234* (2013.01); *H05K 7/1485* (2013.01); *H05K 7/1488* (2013.01); *H05K 7/183* (2013.01); *H02B 1/013* (2013.01)

(58) Field of Classification Search
CPC ... A47B 2097/006; A47B 47/00; A47B 45/00; H04Q 1/02; H04Q 2201/02; H05K 7/18; H05K 7/1488; H05K 7/183; H05K 7/1485; H05K 5/0234; H05K 7/186; H05K 7/00; H02B 1/013; H02B 1/01

USPC ............... 211/26, 189; 312/223.1, 257.1, 312/265.1–265.4; 361/724, 829, 730, 605
See application file for complete search history.

(56) References Cited

U.S. PATENT DOCUMENTS

| | | | | |
|---|---|---|---|---|
| 4,988,008 A | * | 1/1991 | Blum | H02B 1/01 211/182 |
| 5,542,549 A | * | 8/1996 | Siemon | H04Q 1/06 211/189 |
| 5,732,831 A | * | 3/1998 | Kilponen | H05K 7/18 211/26 |
| 5,749,476 A | * | 5/1998 | Besserer | H02B 1/301 211/182 |

(Continued)

FOREIGN PATENT DOCUMENTS

| | | |
|---|---|---|
| DE | 1938879 B2 | 12/1971 |
| DE | 4137836 C1 | 3/1993 |

(Continued)

OTHER PUBLICATIONS

European Search Report for corresponding European Application No. 15167472.8, dated Sep. 28, 2015, 2 pages.

*Primary Examiner* — Jennifer E Novosad
(74) *Attorney, Agent, or Firm* — Harness, Dickey & Pierce, P.L.C.

(57) ABSTRACT

A framework for an electronic or network cabinet, having a first profile frame and a second profile frame, as well as four depth struts. Each depth strut is directly or indirectly connected at corresponding points to the vertical profile frames. Furthermore, the depth struts are dimensioned so that they can absorb and compensate tilting forces of the vertical profile frames.

8 Claims, 2 Drawing Sheets

(56) References Cited

U.S. PATENT DOCUMENTS

| | | | | |
|---|---|---|---|---|
| 6,019,446 | A * | 2/2000 | Laboch | H02B 1/01 211/26 |
| 6,202,860 | B1 * | 3/2001 | Ludwig | H05K 7/1425 211/189 |
| 6,719,150 | B2 * | 4/2004 | Marraffa | H01M 2/1077 211/26 |
| 7,188,735 | B2 * | 3/2007 | Nakagawa | H05K 7/18 211/26 |
| 7,293,666 | B2 * | 11/2007 | Mattlin | G06F 1/181 211/189 |
| 8,091,970 | B2 * | 1/2012 | Francisquini | H02B 1/301 211/192 |
| 8,459,756 | B2 * | 6/2013 | Linhares, Jr. | H05K 7/20736 211/26 |
| 8,787,023 | B2 * | 7/2014 | Lewis, II | H05K 7/18 361/724 |
| 8,913,393 | B2 * | 12/2014 | Mimlitch, III | H05K 7/1488 211/26 |
| 2002/0117462 | A1 | 8/2002 | Hung | |
| 2002/0153335 | A1 * | 10/2002 | Robideau | H05K 7/18 211/26 |
| 2006/0043031 | A1 * | 3/2006 | Rinderer | H05K 7/186 211/26 |
| 2011/0114576 | A1 * | 5/2011 | Hsiao | H05K 7/183 211/26 |
| 2012/0018389 | A1 * | 1/2012 | Fan | H05K 7/1489 211/26 |
| 2012/0018397 | A1 | 1/2012 | Fan | |
| 2012/0049706 | A1 * | 3/2012 | Cottuli | H05K 7/20736 312/236 |
| 2012/0090869 | A1 | 4/2012 | Bumeder et al. | |
| 2012/0273438 | A1 * | 11/2012 | Nordin | H04Q 1/025 211/26 |
| 2013/0148324 | A1 * | 6/2013 | Szolyga | F16M 13/02 361/809 |
| 2013/0213907 | A1 * | 8/2013 | Masse | H05K 5/0217 211/26 |
| 2014/0177164 | A1 * | 6/2014 | Stewart | H05K 7/20145 361/679.46 |
| 2014/0190910 | A1 * | 7/2014 | Arflack | A47B 55/00 211/26 |
| 2015/0144578 | A1 * | 5/2015 | Maiden | A47B 47/025 211/26 |
| 2015/0342082 | A1 * | 11/2015 | Roehrl | H05K 7/183 211/26 |

FOREIGN PATENT DOCUMENTS

| | | |
|---|---|---|
| DE | 4207282 A1 | 9/1993 |
| DE | 29921290 U1 | 2/2000 |
| DE | 20103357 U1 | 5/2001 |
| DE | 10311374 A1 | 9/2004 |
| DE | 102010048503 A1 | 4/2012 |

* cited by examiner

FRAMEWORK FOR ELECTRONIC OR NETWORK CABINETS

FIELD

The invention relates to a framework for supporting electronic components, and more particularly to a framework for forming an electronic or a network cabinet.

BACKGROUND

Generic frameworks are used to construct electronic or network cabinets. These cabinets, which are also known as enclosures or 19" racks, are used for example to accommodate electronic equipment, power supply and/or cabling components in IT and/or switching technology. They are mostly found in computer centers but are also used individually. Depending upon the desired function of the electronic or network cabinet, different frameworks are known.

For example a combination of different frames is known from DE 10 2010 048 503 A1. Here, the cabinet has an outer frame comprising vertical, horizontal or depth struts.

However, frameworks are also known which function in the manner of an inner frame. Such a frame is known for example from DE 10 311 374 B4. The framework used in each case is chosen in dependence upon the desired use of the electronic or network cabinet as this framework influences the properties of the electronic or network cabinet.

SUMMARY

It is the object of the invention to indicate a framework for an electronic or network cabinet which offers high degrees of freedom for the cable routing and has a simple structure.

This object is achieved according to the invention by a framework for an electronic or network cabinet according to claim 1.

Further advantageous embodiments are indicated in the dependent claims, the description, the figures and the description thereof.

A framework according to the invention for an electronic or network cabinet has a first and a second vertical profile frame, which are each constructed from two horizontal and two vertical frame struts. Furthermore the framework according to the invention also has four depth struts, wherein each depth strut is directly or indirectly connected at corresponding positions to a vertical frame strut of the first vertical profile frame and of the second vertical profile frame.

In addition the depth struts have such dimensions that they can absorb and compensate forces and torques, in particular tilting forces, of the two vertical frame profiles, in particular in the depth direction. This can be understood in the sense of the invention in that the depth struts essentially do not deform through the effect of these forces.

Furthermore the vertical frame struts have a grid for fixing components to be incorporated, for example servers or switches.

A core idea of the invention can be seen in using only an inner frame without a further outer frame to construct the framework. The inner frame is formed essentially by the two vertical profile frames. Such profile frames were conventionally interconnected by means of cover or base elements. However, this has the disadvantage that the degrees of freedom for cable routing and cable feeding are reduced. Cable routing according to the meaning of the invention can be understood to be in particular the laying of cables, such as power or network cables, to a cabinet and away from a cabinet but also within a cabinet. These cables can be routed for example to or from above, to or from below or to or from the side.

This was recognised according to the invention. Consequently the two vertical profile frames according to the invention are interconnected, in particular exclusively, by means of depth struts, which are arranged to the side of or on the vertical profile frames. Unhindered access to the space which is formed between the two vertical profile frames is thus possible both from above and also from below. In other words, it is ensured through the construction according to the invention that, particularly when using the framework according to the invention in computer centers, a relatively simple feeding of cables both from above and from below, such as from a false floor or from a suspended ceiling, is possible. The cable routing to and from adjacent cabinets is also hereby facilitated as well as within the cabinet. These degrees of freedom can be achieved only to a clearly lower extent with known constructions.

It is hereby essential to dimension the depth struts in such a way that they offer sufficient stability for the upright framework. This also includes the connection of the depth struts to the vertical frame struts of the vertical profile frames.

According to an advantageous embodiment the depth struts are directly or indirectly connected respectively in the upper and in the lower region of the vertical frame struts, in particular the end regions thereof, to the vertical frame struts. In other words, the contact points of the depth struts with the vertical frame struts are located at the start or respectively at the end of the vertical frame struts and thus at the outer points or regions thereof. A particularly good stability can hereby be achieved.

It is advantageous if spacers are provided between the vertical frame struts and the depth struts at each connection region in order to define the width of the framework, and if the depth struts are fixed to the spacers and the spacers to the vertical frame struts. By means of this construction it is possible for the width of the electronic or network cabinet that can be constructed by means of the framework according to the invention to be varied. Through a greater width, which can be achieved by the spacers, there is more space inside an electronic or network cabinet that can be constructed by means of the framework according to the invention so that even higher degrees of freedom for cable routing can be achieved.

It is advantageous if means for attaching feet are provided at the end regions of the lower horizontal frame struts. In other words, the standing area of the framework according to the invention is located directly below the vertical frame struts of the vertical profile frames. It is hereby ensured that the weight which acts on the vertical frame struts through the devices incorporated therein can be carried away directly into the base and does not affect the depth struts. Higher loads can also be provided in the framework according to the invention, since going out of shape or warping due to the high loads can be reduced or excluded.

Alternatively or as a supplement hereto, means for attaching feet can also be provided on the lower depth struts.

A further advantage arises through the direct introduction of force via the vertical profile frames or vertical frame struts thereof into the base, without other components of the framework or components of the electronic or network cabinet constructed by means of the framework experiencing an introduction of force. That advantage is that a compression through the weight does not affect these further parts to be incorporated, which also include the depth struts. Drawer elements can thus also be provided in lower regions.

It is essential to the invention that the depth struts have adequate stability to absorb forces coming from the vertical frame struts, in particular tilting forces. It has proved to be advantageous in this connection to design the depth struts with a C-shaped cross-section, whereby the open side of the C is provided in the direction of the vertical profile frames.

A further advantage of this construction is that, all in all, only two or only three different components are required for the construction of the framework according to the invention, even with different designs.

According to an advantageous embodiment, the vertical frame struts each have a metric grid and/or an inch-based grid. Through this standardised grid it is particularly easy to fix elements to be incorporated to the vertical profile frames.

It is advantageous if the depth struts have fixing means to attach side panels. Likewise, hinge elements can be provided for coupling of a front-side and/or rear-side door or also the side elements. By providing side panels and/or door elements on the depth struts the latter can be located as far as desired from the inner lying vertical profile frames when using spacers, meaning that large degrees of freedom are present with respect to the depth and the width of the electronic cabinet. In particular, only a few parts must be adapted for a wider version or deeper version.

It is advantageous if the connections between the depth struts and the vertical frame struts, and respectively the connections between the depth struts and the spacers as well as the connections between the spacers and the vertical frame struts, have such dimensions that torsional forces of the framework perpendicular to the connection direction can be absorbed and compensated by them in the depth direction. Within the scope of the invention, it can be understood in this sense, in particular, that the connections are designed to be strong enough so that the torsional forces do not lead to warping of the whole framework.

Through such a design of the connections, it is ensured that a structure compulsorily having a base and a closing cover element can be omitted. This is because the stability normally incorporated by these components is already provided by the depth struts with the corresponding connections for the framework.

It is advantageous if within the framework according to the invention only the two vertical profile frames, the four depth struts and/or the eight spacers are designed as supporting elements of the framework. This allows all further components to be incorporated to be designed as simply as possible or also to be completely omitted in dependence upon the degrees of freedom required for cabling.

BRIEF DESCRIPTION OF DRAWINGS

The invention will be explained in greater detail below by reference to an embodiment and a schematic drawing, in which.

DETAILED DESCRIPTION

Figure 1:
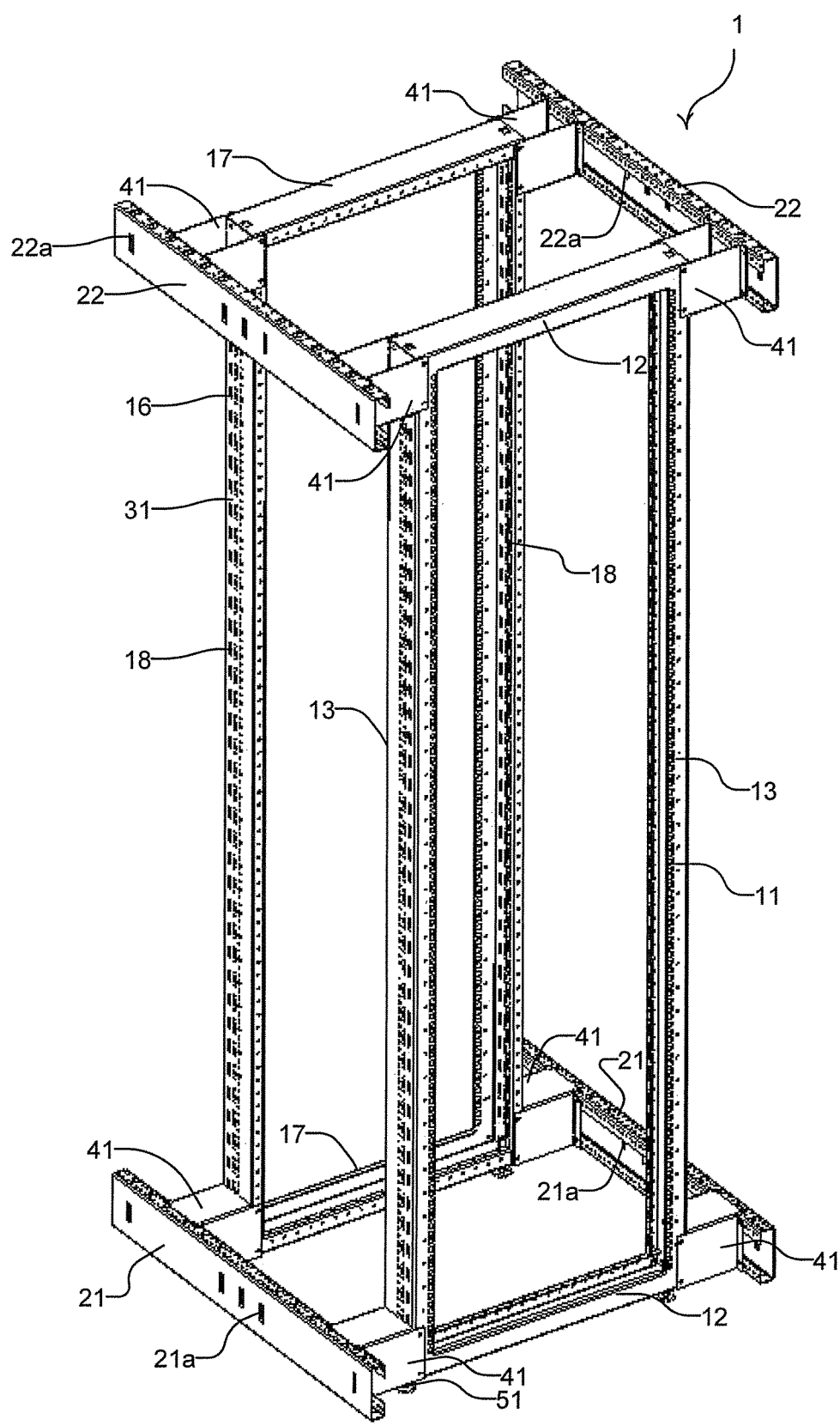
FIG. 1 shows the basic structure of a framework according to the invention.
Figure 2:
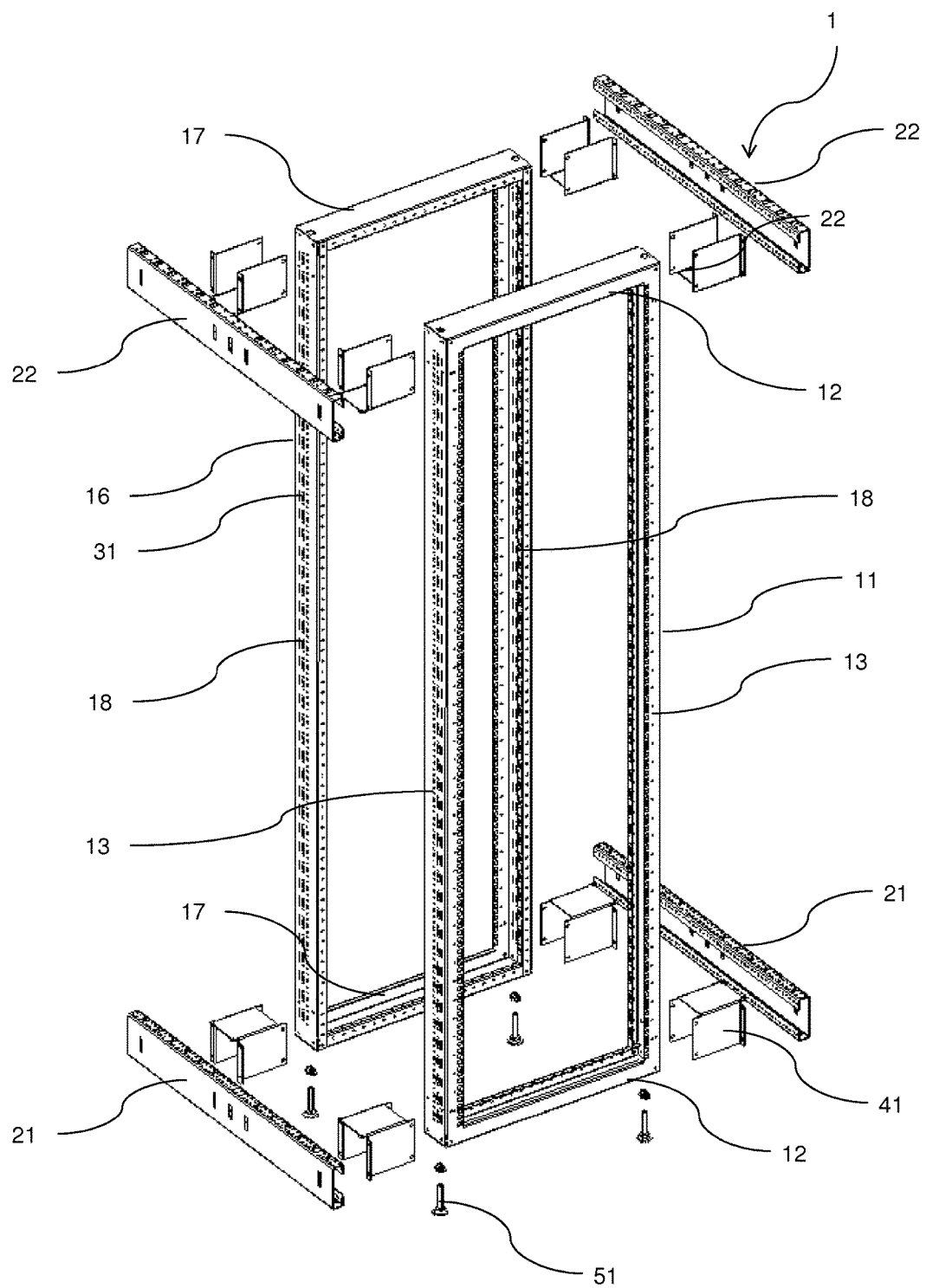
FIG. 2 shows an exploded view of the framework according to the invention according to FIG. 1.

FIGS. 1 and 2 show a framework 1 according to the invention. This has two vertical profile frames 11 and 16, two lower depth struts 21, two upper depth struts 22 and also eight spacers 41. Both vertical profile frames 11, 16 can in principle be identically constructed.

The vertical profile frames 11,16 each consist of two horizontal frame struts 12, 17 and also two vertical frame struts 13, 18. The horizontal frame struts 12, 17 and the vertical frame struts 13, 18 are each fixed to each other in such a way that they form the contour of a rectangle. They can be welded to each other, for example, but can also be interconnected by corner connectors. The complete profile frame 11, 16 can thus also be produced to form a single part.

Spacers 41 are fixed to the lower end regions of the vertical frame struts 13, 18. In turn the lower depth struts 21 are attached to the spacers 41. An analogous construction is provided at the upper end region of the vertical profile frames 11, 16. The spacers 41 are provided here at the ends of the vertical frame struts 13, 18. The upper depth struts 22 are fixed to the spacers 41.

It is essential to the invention that adequate stability for the electronic and/or network cabinet to be constructed should be achieved through the components, described here, of the framework 1 according to the invention. This means that, in particular, the depth struts 21, 22, and also the optionally usable spacers 41, must be designed to be sufficiently stable in order to absorb the forces which act in particular on the vertical profile frames 11 and 16.

Similarly, the vertical profile frames 11 and 16 themselves must already be designed to be sufficiently resistant to torsion. Otherwise, the electronic or network cabinet that can be constructed based on the framework 1 according to the invention would lack sufficient stability. In other words, the vertical profile frames 11, 16 are designed through a suitable choice of materials and/or through the geometries used, or are dimensioned, so that they themselves are already resistant to torsion.

In order to fix electronic components, for example servers, switches or also switchboards, in the framework 1, the vertical profile frames 11, 16 have a grid 31. This can be both a metric grid and also an inch-based grid. It is likewise possible to provide both grids on the vertical profile frames 11, 16. The grid is preferably formed in this case in the region of the vertical frame struts 13, 18.

In the outer regions of the lower horizontal frame struts 12, 17, fixings for feet 51 are provided. Through the feet 51 provided at these points it is possible to introduce the weight of structures which are incorporated into the vertical profile frames 11, 16 directly into the base. The admissible overall load for the cabinet is consequently higher than in the case of fixings in the region of the depth struts 21.

Side panels as well as front and/or rear door elements can be attached in the framework 1 according to the invention to attachment points 21a and 22a of the depth struts 21, 22. It is essential in the construction according to the invention that the framework 1 according to the invention can be designed on the front and/or rear side horizontally and/or vertically without struts. It can likewise be designed without a base and/or cover element. In other words, this means that neither front struts nor rear struts nor a base element nor a cover element, which can also be described as a lid, are compulsorily necessary. The cable feeding from above, from below and/or from the side can hereby be clearly facilitated.

As already explained, the vertical profile frames 11, 16 are to be identically designed. In order to facilitate the incorporation of components it is advantageous if the vertical profile frames 11, 16 have a front and a rear side. This can be realised, for example, through a different design of the horizontal frame struts 12, 17, and also the vertical frame struts 13, 18. If the vertical profile frames 11, 16 are designed in this way, they are incorporated rotating them by 180° relative to each other. This means that the front side of the vertical profile frames 11, 16 respectively points outwards, while the rear side of the vertical profile frames 11, 16 respectively points inwards, thus into the inner space defined by the framework.

By means of the framework 1 according to the invention it is possible to construct an electronic or network cabinet in a simple manner and to nonetheless facilitate high degrees of freedom for cabling.

The invention claimed is:

1. A framework for an electronic or network cabinet, comprising:
    a first vertical profile frame and a second vertical profile frame, wherein each of said first and second vertical profile frames includes two horizontal frame struts and two vertical frame struts,
    four depth struts, wherein selected ones of each of said depth struts are indirectly connected at corresponding positions to one of the vertical frame struts of the first vertical profile frame and one of the vertical frame struts of the second vertical profile frame,
    wherein the depth struts are dimensioned in order to be able to absorb and compensate tilting forces of the first and second vertical profile frames in a depth direction, wherein the depth direction is a direction of the depth struts,
    wherein the vertical frame struts have a grid for fixing components to be, accommodated in the framework,
    a plurality of spacers, the plurality of spacers helping to define an overall width of the framework and being provided between the vertical frame struts and the depth struts at upper and lower regions of the vertical frame struts,
    wherein the depth struts are fixed to the spacers and the spacers are fixed to the vertical frame struts; and
    wherein the depth struts each have a C-shaped cross-section, and an open side of the C-shaped cross section is provided toward a respective one of the first or second vertical profile frames and a closed side of the C-shaped cross-section is provided in the opposite direction thereof, and further wherein the depth struts are outwardly spaced apart from the vertical frame struts.

2. The framework according to claim 1, wherein the depth struts are each directly connected in upper and lower regions of the vertical frame struts to the vertical frame struts.

3. The framework according to claim 1, further comprising:
    means for attaching feet at end regions of lower ones of the horizontal frame struts or on the depth struts.

4. The framework according to claim 1, wherein the vertical frame struts or the horizontal frame struts are respectively identically constructed.

5. The framework according to claim 1, wherein the vertical frame struts each have a metric or inch-based grid being defined by holes in the vertical frame struts.

6. The framework according to claim 1, further comprising attachment points on the depth struts for attaching side panels on the depth struts.

7. The framework according to claim 1, wherein connections between the depth struts and the spacers, and additional connections between the spacers and the vertical frame struts, are dimensioned to be able to absorb and compensate torsional forces of the framework perpendicular to a torsion direction in the depth direction.

8. The framework according to claim 1, wherein only the first and second vertical profile frames, the plurality of depth struts and the plurality of spacers are constructed to operate as supporting structural components to form the framework.

* * * * *